(12) United States Patent
Tomita et al.

(10) Patent No.: US 12,066,759 B2
(45) Date of Patent: Aug. 20, 2024

(54) LIGHT SOURCE APPARATUS, EXPOSURE APPARATUS, AND ARTICLE MANUFACTURING METHOD

(71) Applicant: CANON KABUSHIKI KAISHA, Tokyo (JP)

(72) Inventors: Hiroyuki Tomita, Tochigi (JP); Hiroshi Fukazawa, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 101 days.

(21) Appl. No.: 17/482,812

(22) Filed: Sep. 23, 2021

(65) Prior Publication Data

US 2022/0107485 A1    Apr. 7, 2022

(30) Foreign Application Priority Data

Oct. 2, 2020 (JP) .................................. 2020-167964

(51) Int. Cl.
*G03F 7/00* (2006.01)
*F21V 29/60* (2015.01)
*G02B 19/00* (2006.01)

(52) U.S. Cl.
CPC .......... *G03F 7/70016* (2013.01); *F21V 29/60* (2015.01); *G02B 19/0019* (2013.01);
(Continued)

(58) Field of Classification Search
CPC ............. G03F 7/70016; G03F 7/70833; G03F 7/70858; G03F 7/70891; G03F 7/70175; G03F 7/7015; G03F 7/70; G03F 7/708; G03F 7/70825; G03F 7/70841; G03F 7/70883; G03F 7/70908–70933;
(Continued)

(56) References Cited

U.S. PATENT DOCUMENTS 4,630,182 A * 12/1986 Moroi .................... F21V 29/83
362/345
6,771,353 B2 * 8/2004 Sato .................... G03F 7/70058
355/53
(Continued)

FOREIGN PATENT DOCUMENTS

JP        2001135134 A     5/2001
JP        2003017003 A     1/2003
(Continued)

OTHER PUBLICATIONS

English translation of JP2004-241622, published Aug. 26, 2004. (Year: 2004).*
(Continued)

*Primary Examiner* — Christina A Riddle
(74) *Attorney, Agent, or Firm* — ROSSI, KIMMS & McDOWELL LLP

(57) ABSTRACT

A light source apparatus includes a holder configured to hold a lamp including a metal base having a cylindrical surface, a condensing mirror configured to condense light generated by the lamp, and a nozzle including an ejection hole configured to eject a gas to cool the metal base. A distance between a straight line including a center axis of the ejection hole and a center axis of the metal base ranges from not less than ½ of a radius of the cylindrical surface to not more than the radius.

13 Claims, 13 Drawing Sheets

(52) U.S. Cl.
CPC ..... *G02B 19/0047* (2013.01); *G03F 7/70858* (2013.01); *G03F 7/70891* (2013.01)

(58) Field of Classification Search
CPC ............... G03F 7/7095; G03F 7/70958; G03F 7/70975; G03F 7/70991; F21V 29/60; G02B 19/0047; G02B 19/0019; H01L 21/027
USPC ..................... 355/18, 30, 52–55, 67–77, 133
See application file for complete search history.

(56) References Cited

U.S. PATENT DOCUMENTS

| | | | | |
|---|---|---|---|---|
| 2008/0218049 | A1* | 9/2008 | Shirasu | F21V 19/006 |
| | | | | 313/46 |
| 2010/0118287 | A1* | 5/2010 | Kikuchi | H01J 5/62 |
| | | | | 313/35 |
| 2016/0266497 | A1* | 9/2016 | Suda | G02B 19/0028 |

FOREIGN PATENT DOCUMENTS

| | | | | |
|---|---|---|---|---|
| JP | 2004241622 | A | * | 8/2004 |
| JP | 2018105931 | A | | 7/2018 |
| TW | 201527898 | A | | 7/2015 |

OTHER PUBLICATIONS

Office Action issued in Taiwanese Appln. No. 110135091, mailed Jan. 16, 2024. English translation provided.

* cited by examiner

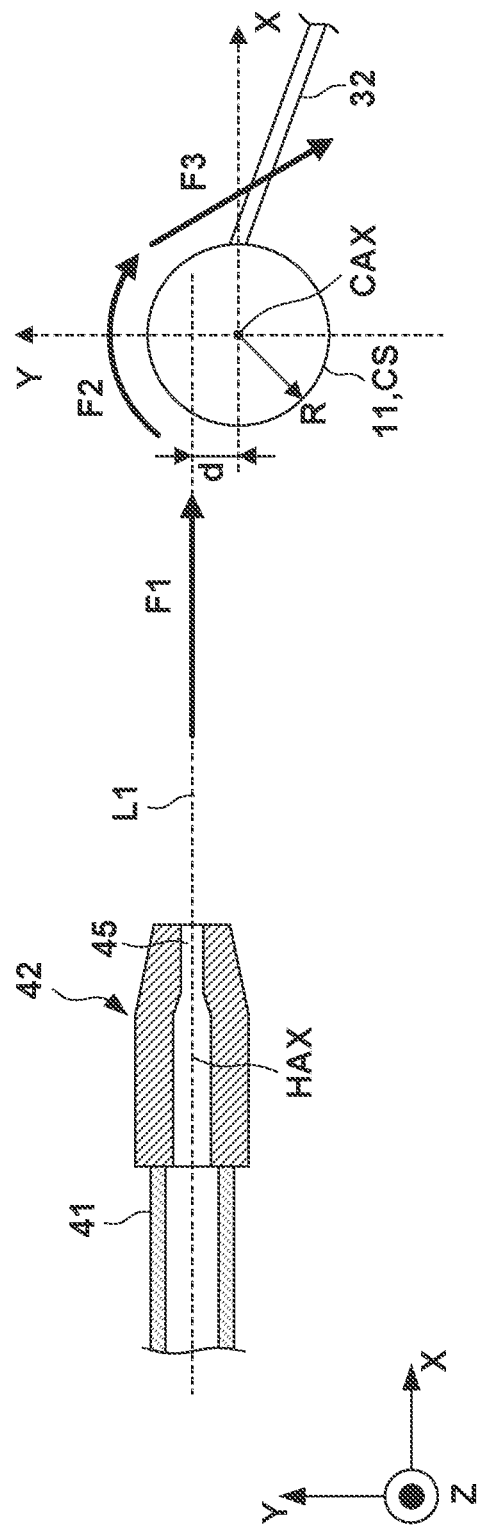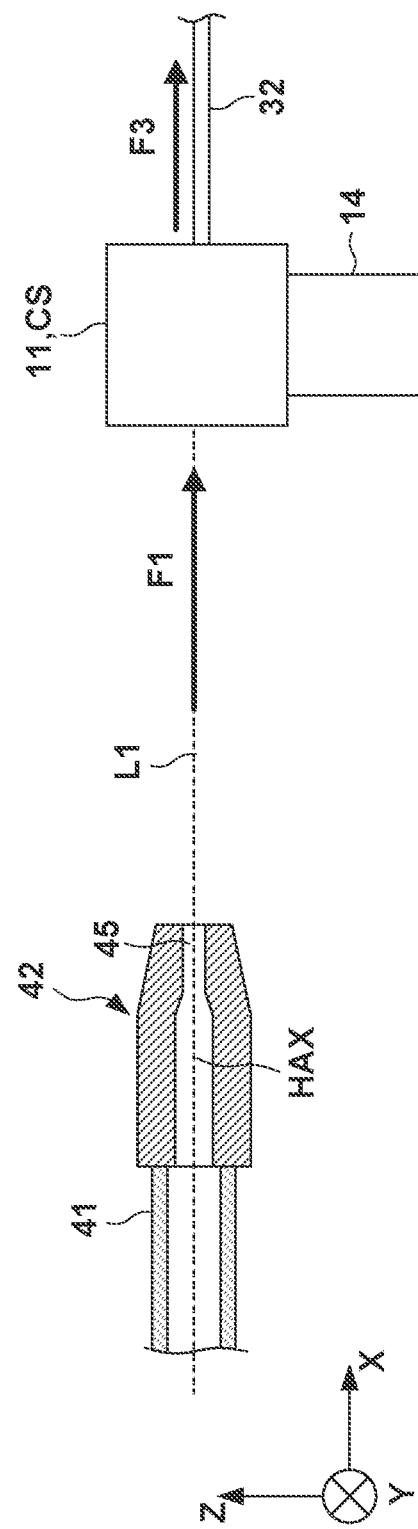

LIGHT SOURCE APPARATUS, EXPOSURE APPARATUS, AND ARTICLE MANUFACTURING METHOD

BACKGROUND OF THE INVENTION

Field of the Invention

The present invention relates to a light source apparatus, an exposure apparatus, and an article manufacturing method.

Description of the Related Art

An exposure apparatus is used in a lithography step for manufacturing a device such as a semiconductor device or a display device. A light source apparatus is incorporated in the exposure apparatus, and the light source apparatus can include an exchangeable lamp. The lamp includes, for example, a pair of metal bases, a light emitting tube arranged between the pair of metal bases, and a pair of electrodes arranged in the light emitting tube and connected to the pair of metal bases, respectively. Mercury or the like as a light emitting substance can be enclosed in the light emitting tube. When power is supplied between the pair of electrodes via the pair of metal bases, arc discharge occurs between the pair of electrodes, and the lamp can thus emit light. When the lamp is caused to emit light, the temperature of the metal bases is high, and the metal bases need to be cooled. Japanese Patent Laid-Open No. 2003-17003 describes a light source apparatus that includes, in a metal base portion, a fin configured to increase the cooling efficiency and cools the metal base portion by blowing cooling air to the fin.

The temperature of the metal bases tends to rise along with an increase in the output of the lamp. To sufficiently cool the metal bases, it is necessary to blow a sufficient flow amount of gas to the metal bases. However, if the light emitting tube is excessively cooled by the gas, the light emitting substance such as mercury in the light emitting tube cannot sufficiently be evaporated, and a lighting failure of the lamp may occur.

SUMMARY OF THE INVENTION

The present invention provides a technique advantageous in causing a lamp to stably emit light.

One of aspects of the present invention provides a light source apparatus comprising a holder configured to hold a lamp including a metal base having a cylindrical surface, a condensing mirror configured to condense light generated by the lamp, and a nozzle including an ejection hole configured to eject a gas to cool the metal base, wherein a distance between a straight line including a center axis of the ejection hole and a center axis of the metal base ranges from not less than ½ of a radius of the cylindrical surface to not more than the radius.

Further features of the present invention will become apparent from the following description of exemplary embodiments with reference to the attached drawings.

BRIEF DESCRIPTION OF THE DRAWINGS

FIGS. 4A and 4B are views schematically showing an arrangement example of a metal base and a nozzle in the light source apparatus according to the first embodiment;

DESCRIPTION OF THE EMBODIMENTS

Figure 1:
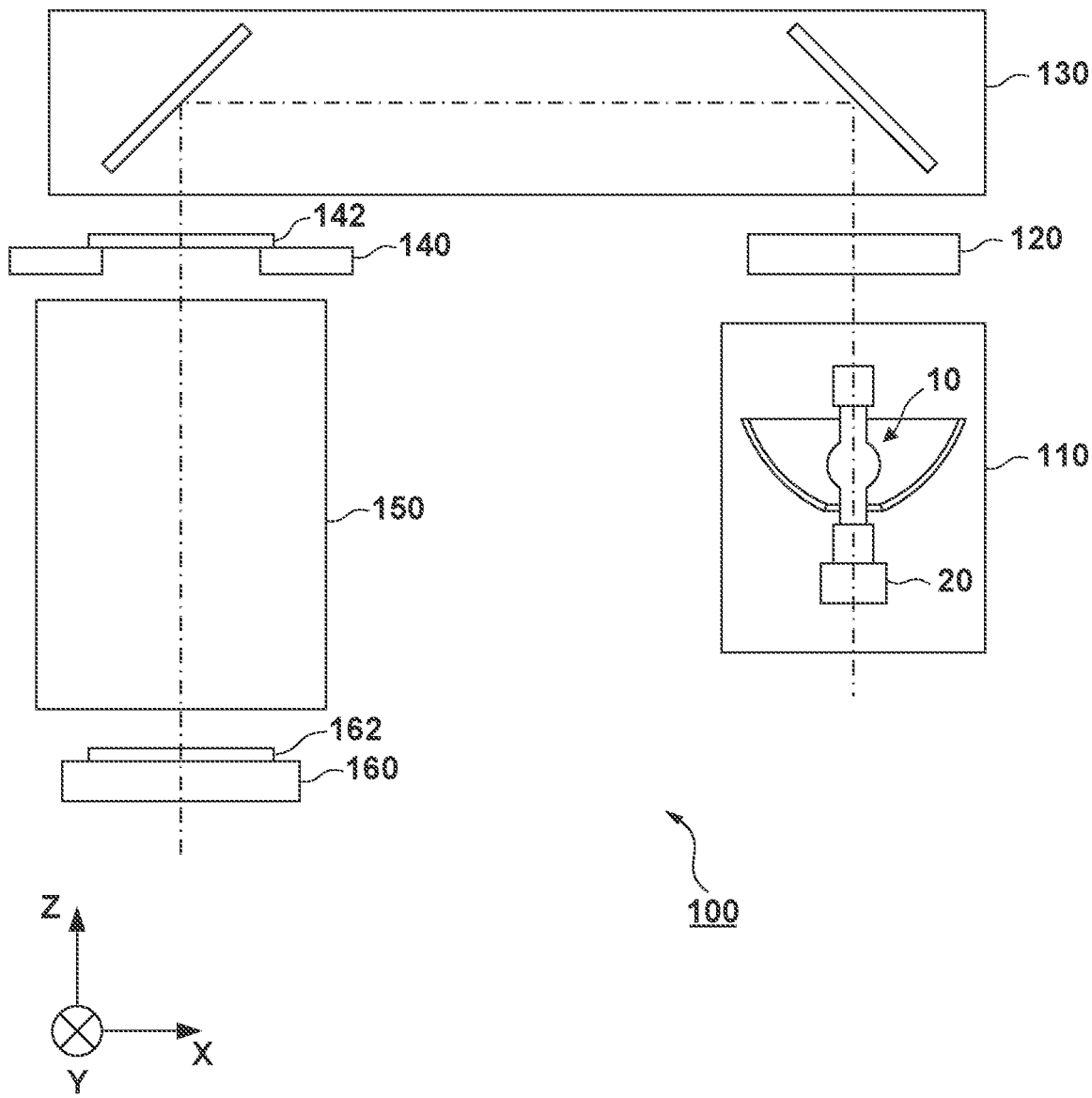
FIG. 1 is a view schematically showing the configuration of an exposure apparatus according to the first embodiment.

Hereinafter, embodiments will be described in detail with reference to the accompanying drawings. It should be noted that the following embodiments are not intended to limit the scope of the appended claims. Although a plurality of features are described in the embodiments, not all the plurality of features are necessarily essential to the present invention, and the plurality of features may arbitrarily be combined. In addition, the same reference numerals denote the same or similar parts in the accompanying drawings, and a repetitive description will be omitted. In this specification and the drawings, directions are indicated on an XYZ coordinate system. Typically, the Z-axis indicates the vertical direction, and the X-Y plane indicates the horizontal direction. A hatched portion indicates a cross section.

FIG. 1 shows an example of the configuration of an exposure apparatus 100 according to the first embodiment. The exposure apparatus 100 can include, for example, a light source apparatus 110, a shutter apparatus 120, an illumination optical system 130, an original holder 140, a projection optical system 150, and a substrate holder 160. The light source apparatus 110 can include a holder 20 that holds a lamp 10. The original holder 140 holds an original 142. The original holder 140 is positioned by an original positioning mechanism (not shown), and the original 142 can thus be positioned. The substrate holder 160 holds a substrate 162. The substrate 162 to which a resist (photoresist) is applied by a resist application apparatus is supplied to the exposure apparatus 100. The substrate holder 160 is positioned by a substrate positioning mechanism (not shown), and the substrate 162 can thus be positioned.

The shutter apparatus 120 is arranged such that light can be shielded in an optical path between the light source apparatus 110 and the original holder 140. The illumination optical system 130 illuminates the original 142 using light from the light source apparatus 110. The projection optical system 150 projects the pattern of the original 142 illuminated by the illumination optical system 130 to the substrate 162, and the substrate 162 is thus exposed. This forms a latent image pattern on the resist applied to the substrate 162. The latent image pattern is developed by a developing apparatus (not shown), and the resist pattern is formed on the substrate 162.

Figure 2:
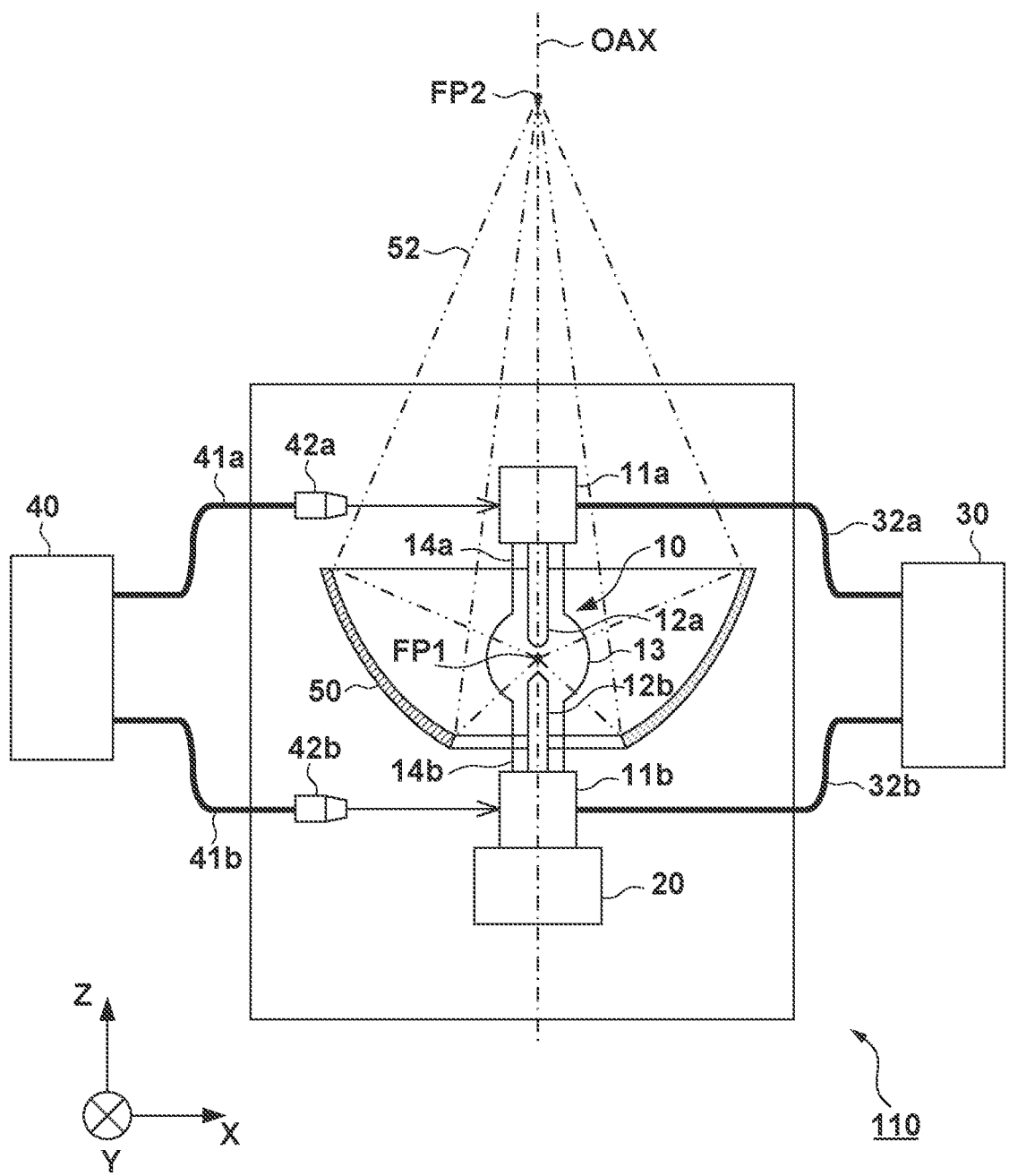
FIG. 2 is a view schematically showing the configuration of a light source apparatus according to the first embodiment.

FIG. 2 shows an example of the configuration of the light source apparatus 110. The light source apparatus 110 can include the holder 20 that holds the lamp 10, a condensing mirror 50 that condenses light generated by the lamp 10, and nozzles 42a and 42b including ejection holes that eject a gas to cool metal bases 11a and 11b of the lamp 10. Also, the light source apparatus 110 can include a power supplier (lamp power supply) 30 that supplies power to the lamp 10 via lead wires (cables) 32a and 32b, and a gas supplier 40 that supplies a gas to the nozzles 42a and 42b via supply tubes 41a and 41b, respectively.

The lamp 10 can be, for example, a short arc type lamp such as a mercury lamp, a xenon lamp, or a metal halide lamp. The condensing mirror 50 can be, for example, an elliptical mirror having two focal points FP1 and FP2. The bright spot of the lamp 10 is arranged at or near the first focal point FP1, and the condensing mirror 50 can reflect light radiated from the bright spot and condense it to the second focal point FP2. The diameter of the opening portion of the condensing mirror 50 can depend on the size of the lamp 10 and is, for example, 300 to 400 mm. Also, the lamp 10 can be arranged on an optical axis OAX (an axis that connects the first focal point FP1 and the second focal point FP2) of the condensing mirror 50. The nozzles 42a and 42b can be arranged to blow high-pressure air supplied from the gas supplier 40 to the metal bases 11a and 11b, respectively. This cools the metal bases 11a and 11b. Not to shield an effective luminous flux 52 reflected by the condensing mirror 50, the nozzle 42a can be arranged outside the effective luminous flux 52. To cool the metal bases 11a and 11b, not air but another cooling medium, for example, a gas such as nitrogen or helium may be used.

The lamp 10 can include the pair of metal bases 11a and 11b, stems 14a and 14b extending from the metal bases 11a and 11b, respectively, a light emitting tube 13 arranged between the stems 14a and 14b, and a pair of electrodes 12a and 12b arranged in the stems 14a and 14b and the light emitting tube 13. The stems 14a and 14b and the light emitting tube 13 can be integrally formed. In an example, the metal base 11a can be an anode-side metal base, the metal base 11b can be a cathode-side metal base, the electrode 12a can be an anode, and the electrode 12b can be a cathode.

Figure 3A:
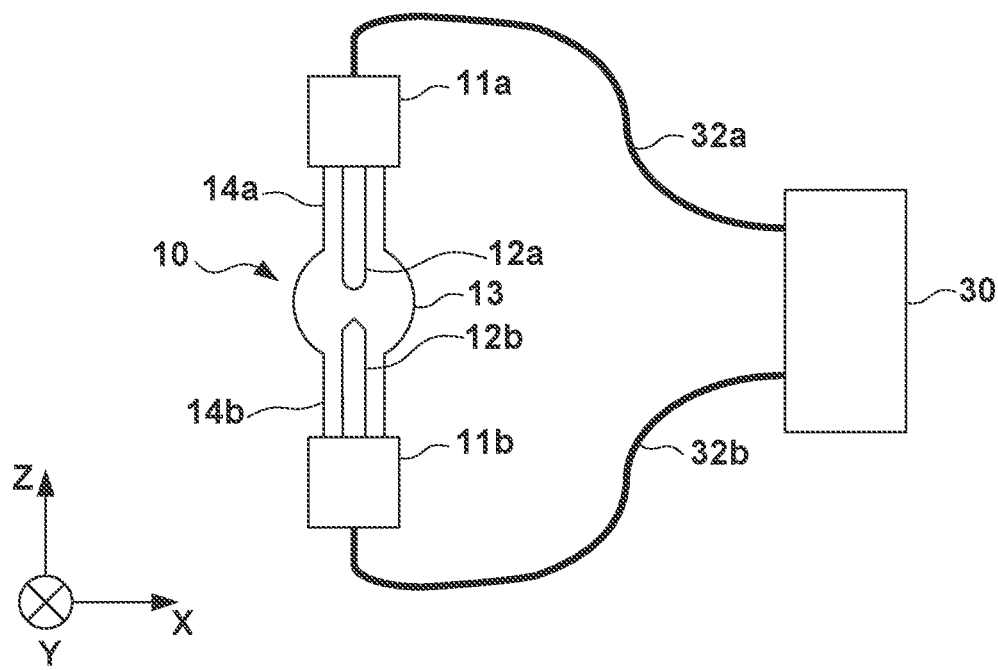
FIGS. 3A and 3B are views showing arrangement examples of lead wires.
Figure 3B:
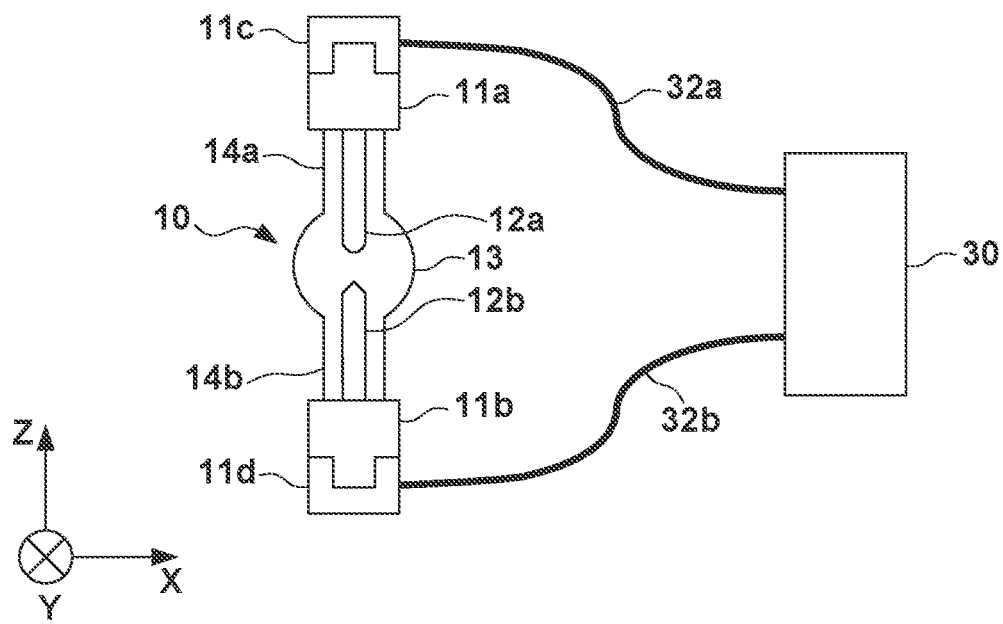

The metal base 11a and the electrode 12a can be connected by a connecting portion such as a molybdenum foil. Similarly, the metal base 11b and the electrode 12b can be connected by a connecting portion such as a molybdenum foil. A rare gas such as neon or xenon, a metal such as mercury, sodium, or scandium, or a substance mixture thereof can be enclosed in the light emitting tube 13. Light is emitted by arc discharge between the pair of electrodes 12a and 12b. The metal bases 11a and 11b can be connected to the power supplier 30 by the lead wires 32a and 32b, respectively. FIG. 2 shows an example in which the lead wires 32a and 32b are connected to the side surfaces of the metal bases 11a and 11b, respectively. The lead wires 32a and 32b may be connected to the end faces of the metal bases 11a and 11b, respectively, as shown in FIG. 3A. Alternatively, as shown in FIG. 3B, the lead wires 32a and 32b may be connected to the metal bases 11a and 11b via connectors 11c and 11d such as lead wire connecting terminals, adapters, or fixing fittings, respectively. Also, the lead wires 32a and 32b may be formed by conductive wires or may be formed by other conductive members.

Note that when explaining the metal bases 11a and 11b without distinction, these will be expressed as a metal base 11 hereinafter. A description about the metal base 11 is a description about the metal base 11a and/or the metal base 11b. Similarly, when explaining the lead wires 32a and 32b without distinction, these will be expressed as a lead wire 32. A description about the lead wire 32 is a description about the lead wire 32a and/or the lead wire 32b. Similarly, when explaining the nozzles 42a and 42b without distinction, these will be expressed as a nozzle 42. A description about the nozzle 42 is a description about the nozzle 42a and/or the nozzle 42b. Similarly, when explaining the supply tubes 41a and 41b without distinction, these will be expressed as a supply tube 41. A description about the supply tube 41 is a description about the supply tube 41a and/or the supply tube 41b.

FIGS. 4A and 4B schematically show an arrangement example of the metal base 11 and the nozzle 42. FIG. 4A shows a plan view, that is, orthogonal projection to the X-Y plane. FIG. 4B shows a side view. The metal base 11 can include a cylindrical surface CS. The nozzle 42 includes an ejection hole 45 that ejects the gas to cool the metal base 11. The ejection hole 45 has a center axis HAX. For example, if the ejection hole 45 has a cylindrical shape, the center axis HAX of the ejection hole 45 matches the center axis of the cylindrical shape. The flow of the gas ejected from the ejection hole 45 is schematically shown as F1, F2, and F3.

A distance (to be referred to as an offset hereinafter) d between a straight line L1 including the center axis HAX of the ejection hole 45 and a center axis CAX of the metal base 11 can range from ½ of a radius R of the cylindrical surface CS to the radius R. Here, the center axis CAX of the metal base 11 is the center axis of the cylindrical surface CS. The center axis CAX of the cylindrical surface CS of the metal base 11 can match the optical axis of the condensing mirror 50. The flow F1 of the gas ejected from the nozzle 42 and blown to the surface of the metal base 11, that is, the cylindrical surface CS changes to the flow F2 along the cylindrical surface CS of the metal base 11, then changes its direction by the Coanda effect and changes to the flow F3, and is blown to the lead wire 32. The metal base 11 can be cooled by the flows F1, F2, and F3 of the gas. The metal base 11 may include a plurality of annular fins around the cylindrical surface CS. As shown in FIG. 2, the nozzle 42a is provided for the metal base 11a, and the nozzle 42b is provided for the metal base 11b.

The elevation angle of the center axis HAX of the ejection hole 45 of the nozzle 42 can fall within the range of −10° to +10°, and the angle of the center axis CAX of the metal base 11 with respect to the vertical direction (Z-axis direction) can fall within the range of −10° to +10°. In another viewpoint, on a plane including the center axis HAX of the ejection hole 45 of the nozzle 42 and parallel to the center axis CAX of the metal base 11, the angle made by the straight line L1 including the center axis HAX of the ejection hole 45 and a plane perpendicular to the center axis CAX of the metal base 11 can fall within the range of −10° to +10°.

Figure 5:
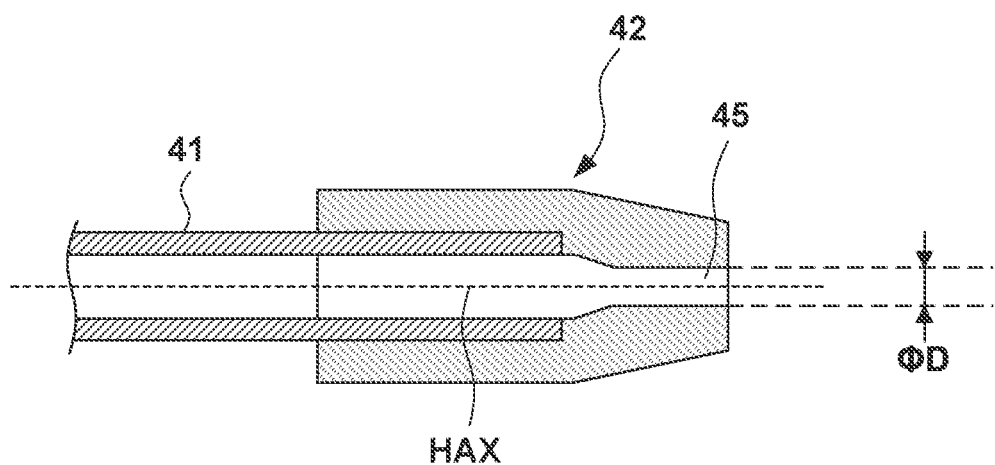
FIG. 5 is a view schematically showing the structure of a nozzle and a supply tube in the light source apparatus according to the first embodiment.

FIG. 5 shows the structure of the nozzle 42 and the supply tube 41. The nozzle 42 can be joined or connected to the supply tube 41 such that leakage of the air or gas does not occur. The ejection hole 45 of the nozzle 42 can be, for example, a circular opening whose diameter OD falls within the range of 1 mm to 2 mm. The flow velocity distribution of the air or gas ejected from the ejection hole 45 can be axisymmetric with respect to the center axis HAX of the ejection hole 45. The maximum flow velocity of the air or gas ejected from the ejection hole 45 can be set within the range of, for example, 50 m/sec to 100 m/sec.

Figure 6A:
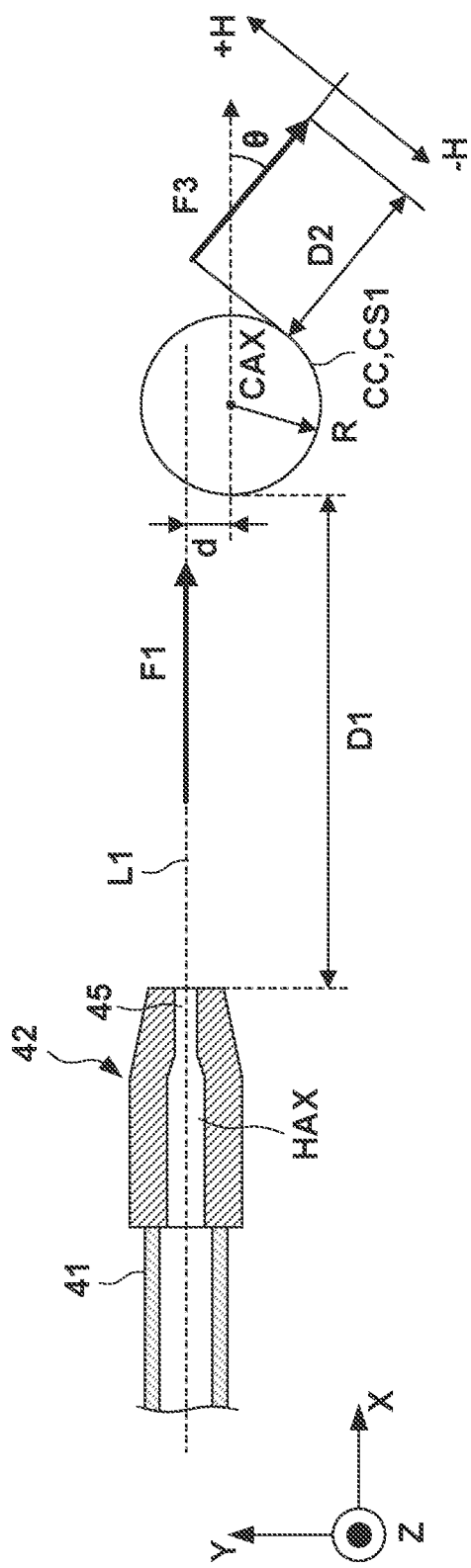
FIGS. 6A and 6B are views for explaining the effects of the light source apparatus according to the first embodiment.
Figure 6B:
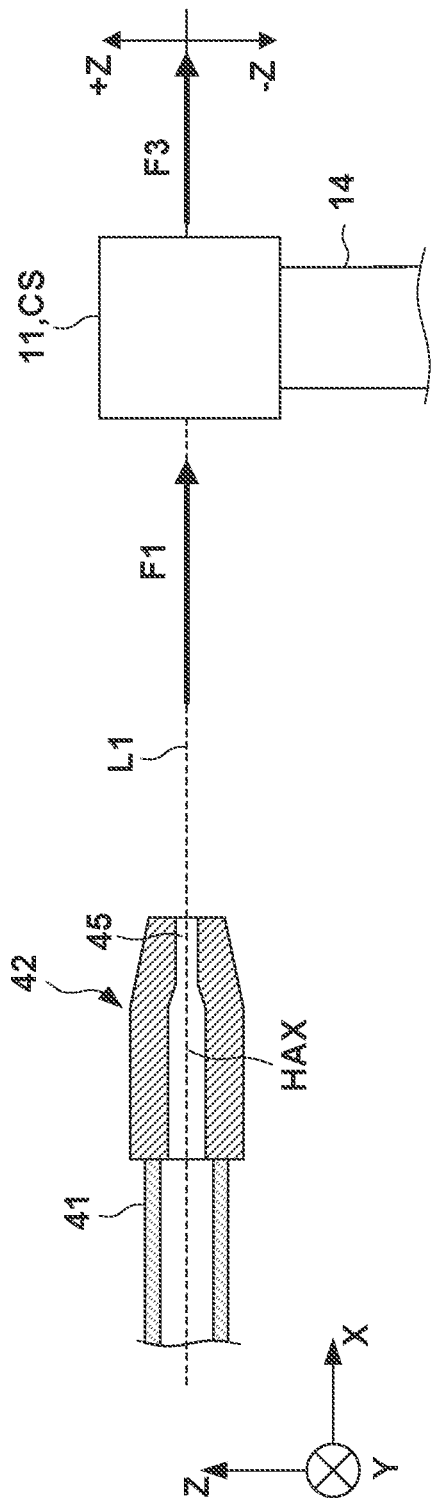

Examples according to the first embodiment will exemplarily be described below with reference to FIGS. 6A, 6B, 7, 8A to 8D, 9A to 9D, and 10. FIG. 6 shows an experimental system used to actually measure the flow of air ejected from the nozzle 42. FIG. 6A shows a plan view. FIG. 6B shows a side view. Let d be the distance (offset) between the straight line L1 including the center axis HAX of the ejection hole 45 and the center axis CAX of the metal base 11, and D1 be the distance between the distal end of the nozzle 42 and a cylindrical surface CS1 (corresponding to the cylindrical surface CS of the metal base 11) that is the side surface of a column CC. Also, let F3 be the flow of the air after passing the cylindrical surface CS1, and θ be the angle difference (refraction angle) between F1 and F3. In addition, the position at a distance D2 from the cylindrical surface CS1 was the position to measure the flow velocity distribution, and flow velocity distributions in the H and Z directions in FIG. 6A were measured. Note that the H direction is a direction orthogonal to F3. A diameter Φ (=2R) of the cylindrical surface CS1 was set to 40 mm, the offset d was set to 0, 5, 10, and 15 mm, the flow amount of the air ejected from the nozzle 42 was set to 50 L/min, the diameter OD of the ejection hole 45 of the nozzle 42 was set to 1.5 mm, and the average flow velocity in the ejection hole 45 was set to 470 m/sec.

Figure 7:
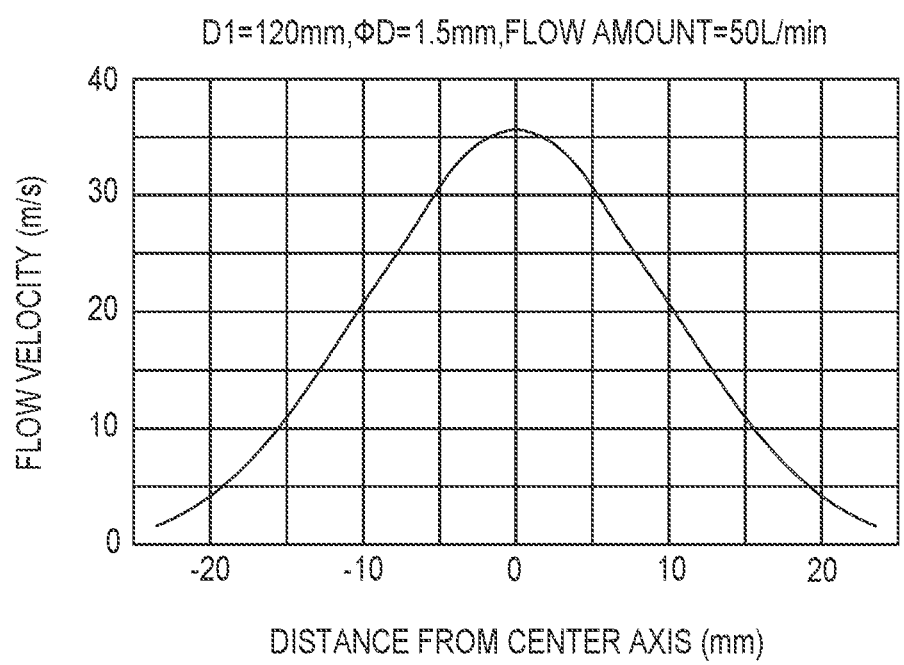
FIG. 7 is a view for explaining the effects of the light source apparatus according to the first embodiment.
Figure 8A:
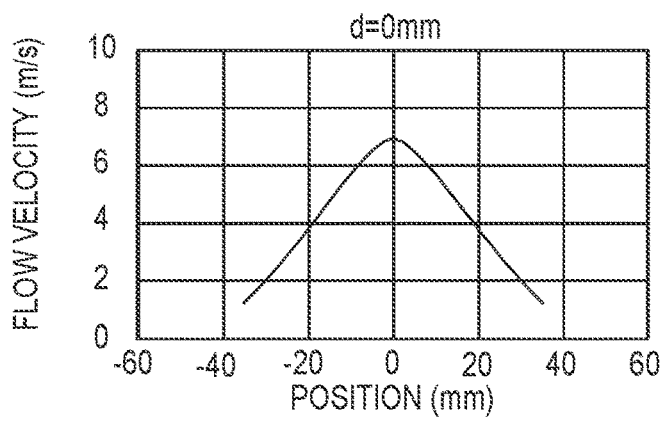
FIGS. 8A to 8D are views for explaining the effects of the light source apparatus according to the first embodiment.
Figure 8B:
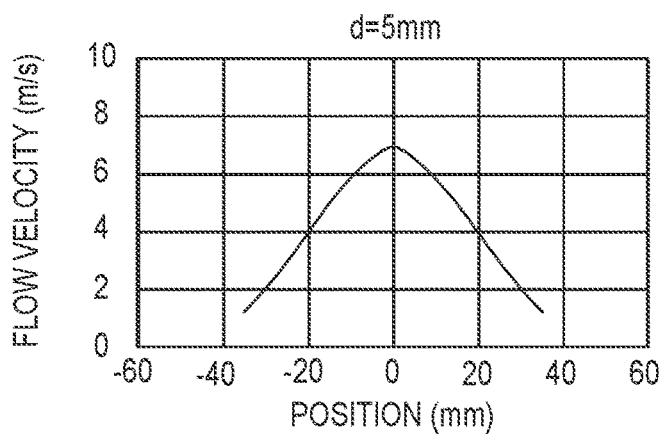
Figure 8C:
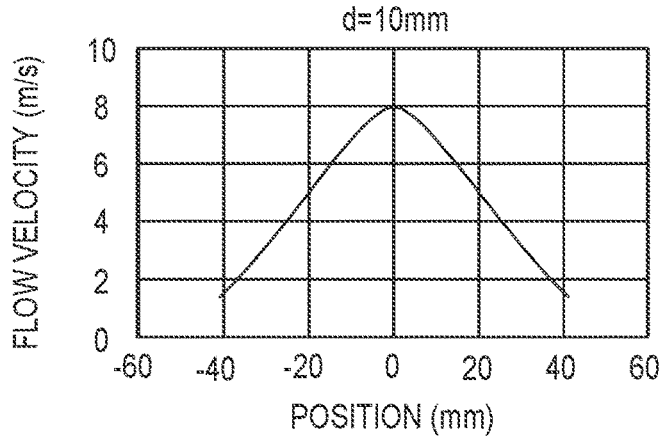
Figure 8D:
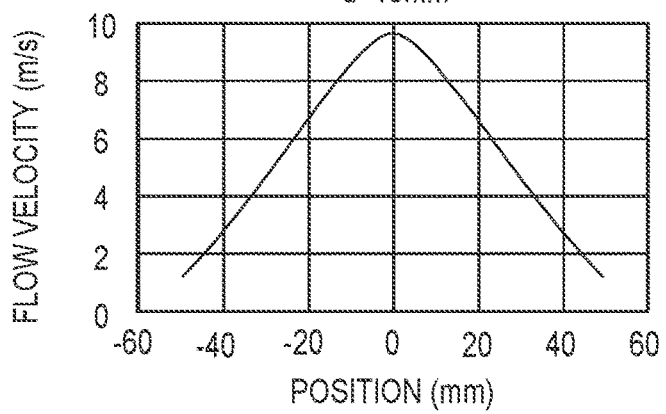
Figure 9A:
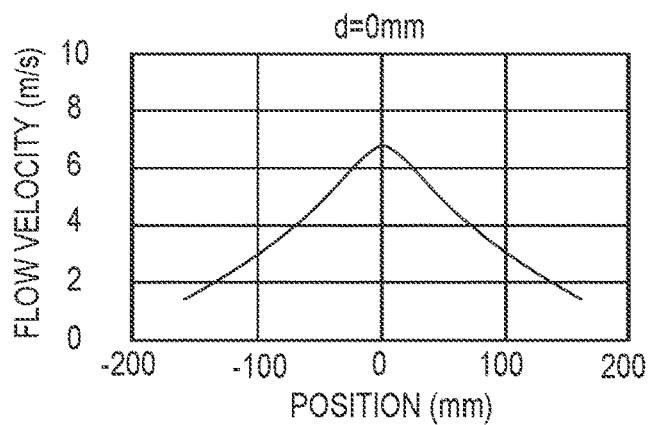
FIGS. 9A to 9D are views for explaining the effects of the light source apparatus according to the first embodiment.
Figure 9B:
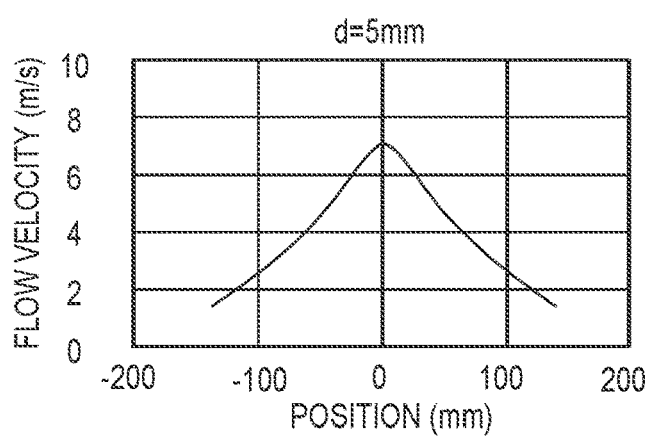
Figure 9C:
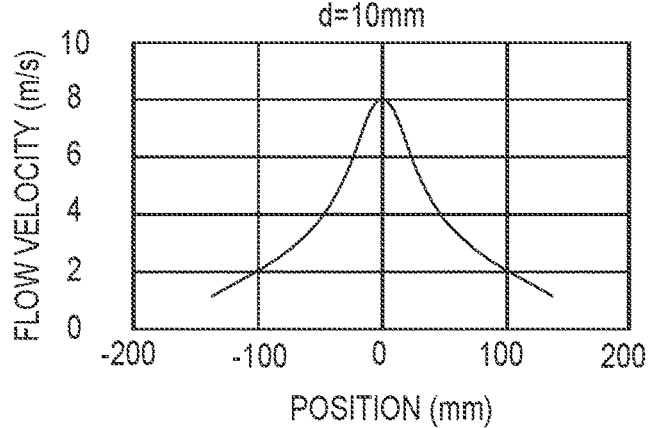
Figure 9D:
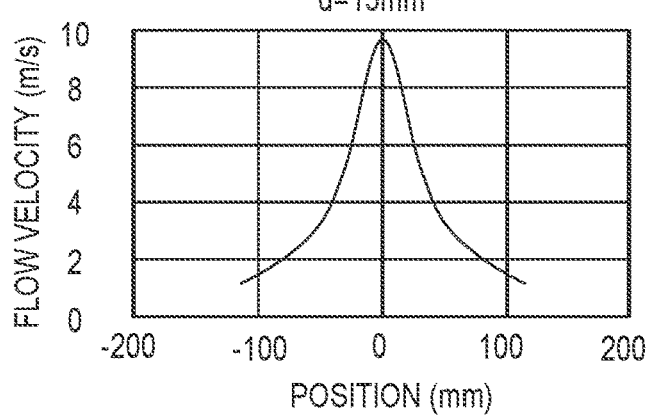

FIG. 7 shows the result of measuring the flow velocity distribution of the air ejected from the nozzle 42 at the position by the distance D1=120 mm from the distal end of the nozzle 42. In the measurement, the column CC shown in FIG. 6A was detached. The abscissa represents the distance from the straight line L1 including the center axis HAX, and the ordinate represents the flow velocity of air. It can be seen that the flow velocity distribution of the air is symmetric with respect to the straight line L1 including the center axis HAX. The distance D1=120 mm is the minimum distance at which the distal end of the nozzle 42 does not shield the effective luminous flux 52 shown in FIG. 2 in a case in which the diameter of the condensing mirror 50 is 300 mm, and the diameter Φ of the cylindrical surface CS of the metal base 11 is 40 mm.

Figure 10:
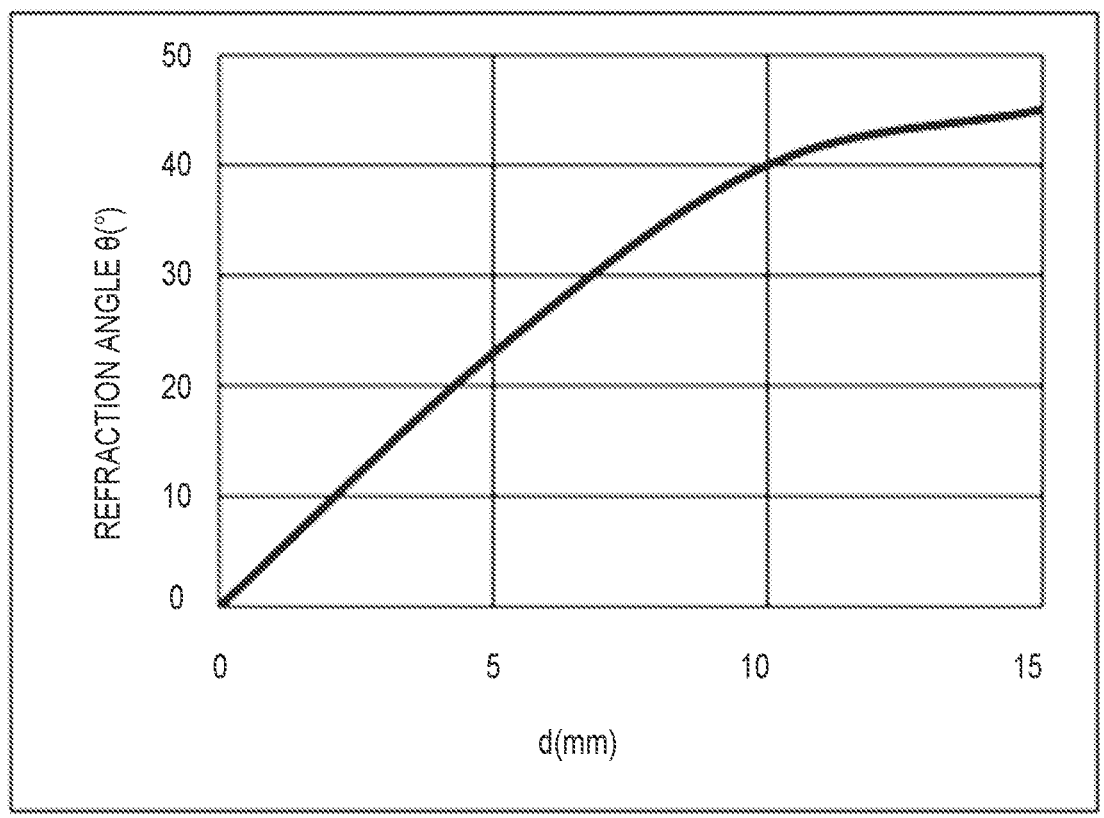
FIG. 10 is a view for explaining the effects of the light source apparatus according to the first embodiment.

FIGS. 8A to 8D show the results of measuring the flow velocity distribution in the ±H directions at the position by the distance D2=100 mm from the cylindrical surface CS1. FIGS. 9A to 9D show the results of measuring the flow velocity distribution in the ±Z directions at the position by the distance D2=100 mm from the cylindrical surface CS1. It can be seen that the larger the offset d is, the narrower the spread of the flow velocity distribution in the ±Z directions is. It can be seen that if the offset d is 10 mm, that is, equal to or larger than ½ of the radius R of the cylindrical surface CS1, the spread of the flow velocity distribution in the ±Z directions can be suppressed within a narrow range. FIG. 10 shows the result of measuring the refraction angle θ under the same conditions as in the measurements shown in FIGS. 8A to 8D and FIGS. 9A to 9D. It can be seen that the refraction angle θ becomes large as the offset d increases, and the refraction angle θ is about 45° when the offset d=15 mm.

In an example, the distance between the metal base 11 and the light emitting tube 13 in the lamp 10 (the length of a stem 14) in the height direction is about 80 mm or more, and the distance between the metal base 11a on the upper side and the upper end of the condensing mirror 50 in the height direction (Z direction) can be set to about 100 mm. Hence, when the offset d is set within the range from ½ of the radius R of the cylindrical surface CS of the metal base 11 to the radius, it is possible to suppress diffusion of the air blown to the metal base 11 to the range other than the metal base 11. This makes it possible to suppress direct cooling of the light emitting tube 13 of the lamp 10 by the air blown to the metal base 11 or indirect cooling of the light emitting tube 13 by the air flowing into the internal space of the condensing mirror 50, and prevent a lighting failure or non-lighting from occurring due to excessive cooling of the lamp 10. Hence, according to the first embodiment, it is possible to cause the lamp 10 to stably emit light.

In addition, along with the improvement of the output of the lamp 10, when the lead wire 32a that supplies power to the metal base 11a is irradiated with the luminous flux reflected by the condensing mirror 50, the temperature of the lead wire 32a may rise and cause oxidation and deterioration of the lead wire 32a. If a dedicated air blowing mechanism is provided to cool the lead wire 32a, the running cost of the exposure apparatus 100 may be increased by an increase in the cost of the light source apparatus 110 or an increase in the air flow amount. When the flow F3 of the air or gas is formed in a portion (temperature increasing portion) of the lead wire 32a irradiated with the luminous flux, the portion of the lead wire 32a can be cooled at a low cost.

Here, to effectively cool the lead wire 32a by the air or gas ejected from the nozzle 42, as shown in FIGS. 4A and 4B, the metal base 11a is arranged between the ejection hole 45 and the connecting portion between the metal base 11a and the lead wire 32a. In the orthogonal projection to the X-Y plane in the XYZ coordinate system in which the center axis CAX of the metal base 11a is the Z-axis, and an axis parallel to the center axis HAX of the ejection hole 45 is the X-axis, the ejection hole 45 is preferably arranged in the second quadrant or the third quadrant. Also, at least the portion of the lead wire 32, which is irradiated with the effective luminous flux 52 from the condensing mirror 50, is preferably arranged in a region formed by the first quadrant and the fourth quadrant.

The flow velocity of the air or gas ejected from the nozzle 42 can be decided in consideration of attenuation of the flow velocity caused by the metal base 11 and the lead wire 32 and the output of the lamp 10. In an example, the flow velocity of the air or gas ejected from the nozzle 42 can be decided within the range of 50 m/sec to 600 m/sec.

Figure 11A:
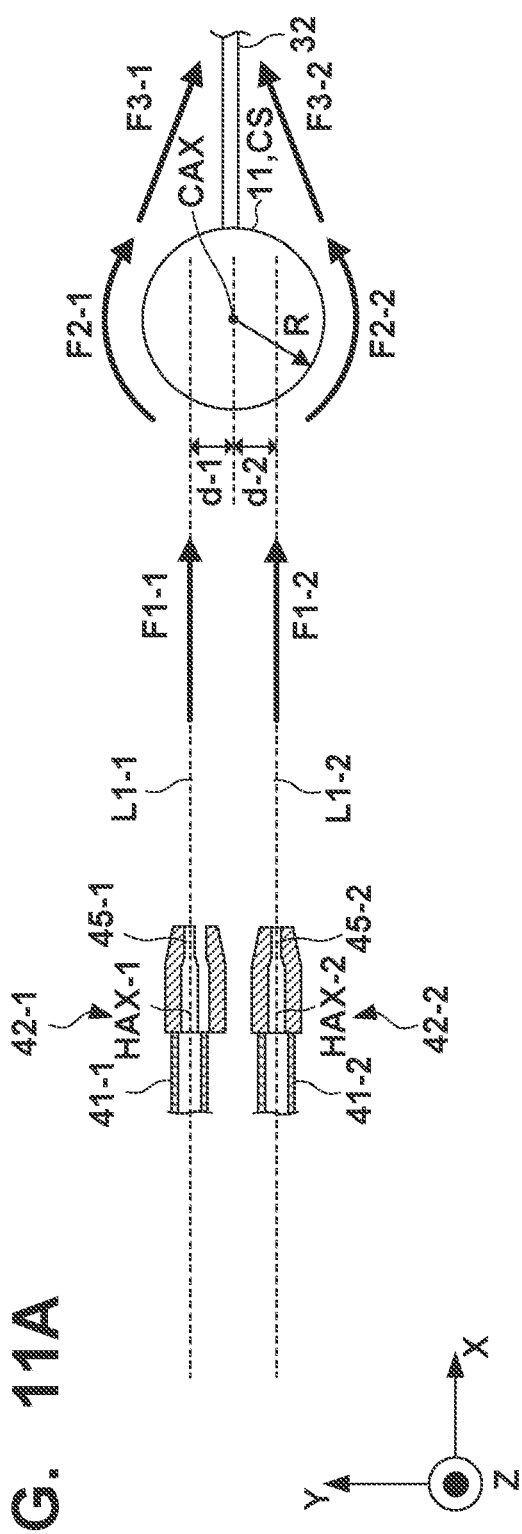
FIGS. 11A and 11B are views schematically showing the configuration of a light source apparatus according to the second embodiment.
Figure 11B:
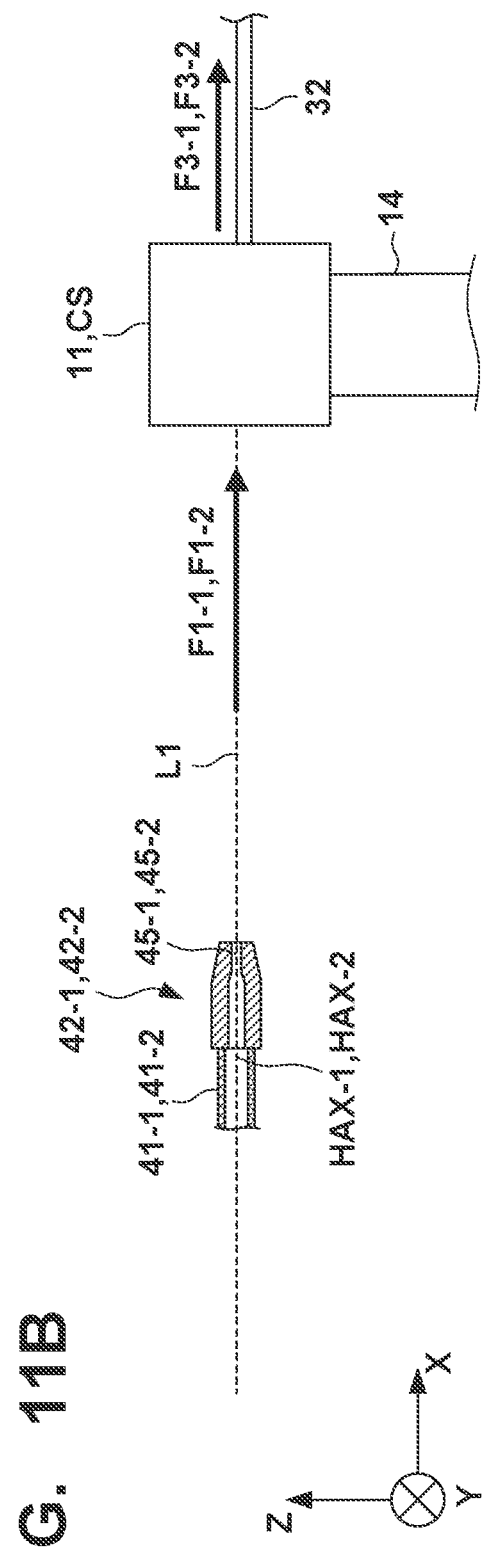

The configuration of a light source apparatus 110 in an exposure apparatus according to the second embodiment will be described below with reference to FIGS. 11A and 11B. Matters that are not mentioned as the second embodiment can comply with the first embodiment. FIGS. 11A and 11B schematically show an arrangement example of a metal base 11 and nozzles 42 in the light source apparatus 110 according to the second embodiment. FIG. 11A shows a plan view, that is, orthogonal projection to the X-Y plane. FIG. 11B shows a side view.

In the second embodiment, the nozzle 42 of the first embodiment is replaced with two nozzles 42-1 and 42-2. A distance (offset) d-1 between a straight line L1-1 including a center axis HAX-1 of an ejection hole 45-1 of the first nozzle 42-1 and a center axis CAX of the metal base 11 can range from ½ or more of a radius R of a cylindrical surface CS to the radius R or less. A distance (offset) d-2 between a straight line L1-2 including a center axis HAX-2 of an ejection hole 45-2 of the second nozzle 42-2 and the center axis CAX of the metal base 11 can range from ½ or more of the radius R of the cylindrical surface CS to the radius R or less. The offset d-1 and offset d-2 may be different from each other, or may be equal to each other. The straight line L1-1 and the straight line L1-2 can be arranged in parallel. The first nozzle 42-1 and the second nozzle 42-2 can be arranged such that the center axis CAX of the metal base 11 is arranged between the straight line L1-1 and the straight line L1-2. The first nozzle 42-1 and the second nozzle 42-2 may be arranged at the same height, or may be arranged at heights different from each other.

A flow F1-1 of a gas ejected from the first nozzle 42-1 and blown to the surface of the metal base 11, that is, the cylindrical surface CS changes to a flow F2-1 along the cylindrical surface CS of the metal base 11, then changes its direction by the Coanda effect and changes to a flow F3-1, and is blown to a lead wire 32. A flow F1-2 of a gas ejected from the second nozzle 42-2 and blown to the surface of the metal base 11, that is, the cylindrical surface CS changes to a flow F2-2 along the cylindrical surface CS of the metal base 11, then changes its direction by the Coanda effect and changes to a flow F3-2, and is blown to the lead wire 32. The flow F3-1 and the flow F3-2 can merge. The flow amount of the gas ejected from the first nozzle 42-1 and the flow amount of the gas ejected from the second nozzle 42-2 may be equal to each other, or may be different from each other.

According to the second embodiment, it is possible to obtain the same effects as in the first embodiment, and it is also possible to improve the cooling capability for the metal base 11 by increasing the area of the metal base 11 to which the air or gas is blown.

Figure 12A:
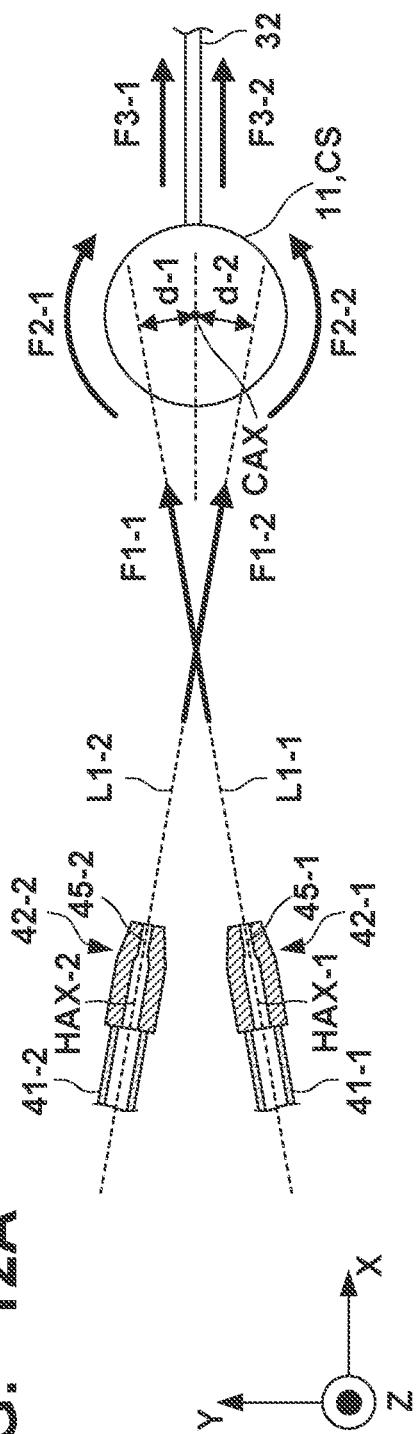
FIGS. 12A and 12B are views schematically showing the configuration of a light source apparatus according to the third embodiment.
Figure 12B:
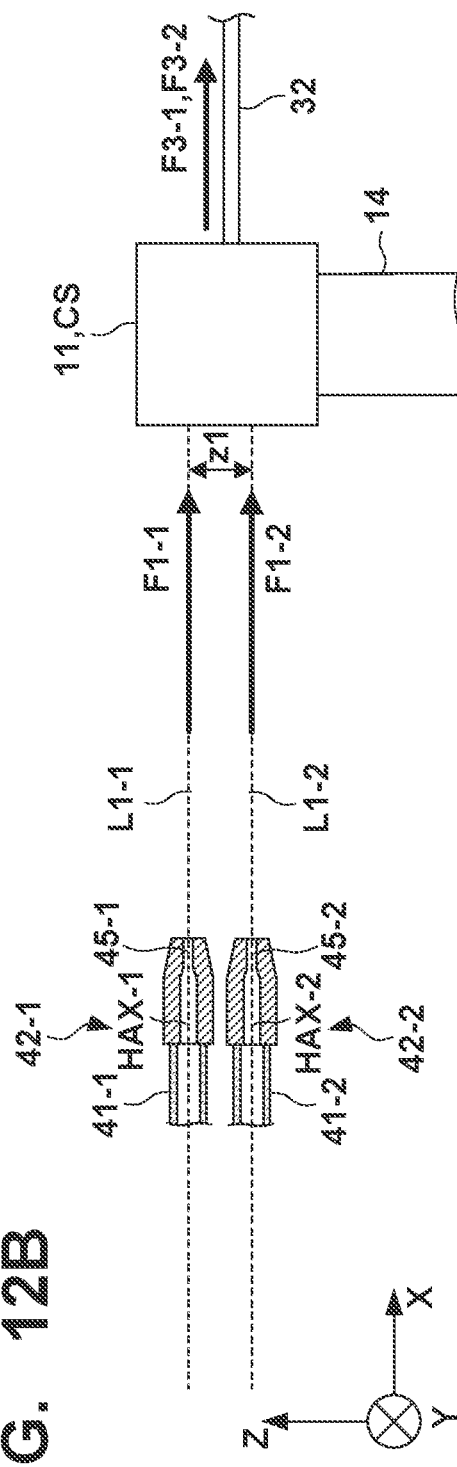

The configuration of a light source apparatus 110 in an exposure apparatus according to the third embodiment will be described below with reference to FIGS. 12A and 12B. Matters that are not mentioned as the third embodiment can comply with the first embodiment. FIGS. 12A and 12B schematically show an arrangement example of a metal base 11 and nozzles 42 in the light source apparatus 110 according to the third embodiment. FIG. 12A shows a plan view, that is, orthogonal projection to the X-Y plane. FIG. 12B shows a side view.

In the third embodiment, the nozzle 42 of the first embodiment is replaced with two nozzles 42-1 and 42-2. A distance (offset) d-1 between a straight line L1-1 including a center axis HAX-1 of an ejection hole 45-1 of the first nozzle 42-1 and a center axis CAX of the metal base 11 can range from ½ or more of a radius R of a cylindrical surface CS to the radius R or less. A distance (offset) d-2 between a straight line L1-2 including a center axis HAX-2 of an ejection hole 45-2 of the second nozzle 42-2 and the center axis CAX of the metal base 11 can range from ½ or more of the radius R of the cylindrical surface CS to the radius R or less. The offset d-1 and offset d-2 may be different from each other, or may be equal to each other.

In the orthogonal projection to the plane (X-Y plane) orthogonal to the center axis CAX of the metal base 11, the straight line L1-1 including the center axis HAX-1 of the ejection hole 45-1 of the first nozzle 42-1 and the second straight line L1-2 including the center axis HAX-2 of the second ejection hole 45-2 of the second nozzle 42-2 cross each other.

A flow F1-1 of a gas ejected from the first nozzle 42-1 and blown to the surface of the metal base 11, that is, the cylindrical surface CS changes to a flow F2-1 along the cylindrical surface CS of the metal base 11, then changes its direction by the Coanda effect and changes to a flow F3-1, and is blown to a lead wire 32. A flow F1-2 of a gas ejected from the second nozzle 42-2 and blown to the surface of the metal base 11, that is, the cylindrical surface CS changes to a flow F2-2 along the cylindrical surface CS of the metal base 11, then changes its direction by the Coanda effect and changes to a flow F3-2, and is blown to the lead wire 32.

In an example, the directions of the first nozzle 42-1 and the second nozzle 42-2 (the directions of the center axes HAX-1 and HAX-2) can be decided in consideration of the refraction angle (θ described above) by the Coanda effect such that the flows F3-1 and F3-2 become almost parallel. According to this configuration, it is possible to suppress stagnation caused by the flows F3-1 and F3-2 interfering with each other and effectively cool the metal base 11 and the lead wire 32.

To prevent interference between the flows F1-1 and F1-2 or reduce interference between these, in a direction parallel to the center axis CAX of the metal base 11, a suitable distance z1 can be provided between the intersection between the straight line L1-1 and the cylindrical surface CS and the intersection between the straight line L1-2 and the cylindrical surface CS. The distance z1 can be, for example, 10 mm or more. The upper limit of the distance z1 can be determined by the size of the metal base 11 in the Z direction. The distance z1 can be set to be, for example, smaller than the size of the metal base 11 in the Z direction. Alternatively, if the elevation angles of the center axes HAX-1 and HAX-2 of the ejection holes 45-1 and 45-2 of the nozzles 42-1 and 42-2 are equal to each other, the height difference between the nozzles 42-1 and 42-2 can be 10 mm or more. The upper limit of the height difference between the nozzles 42-1 and 42-2 can be determined by the size of the metal base 11 in the Z direction, and the height difference can be set to be, for example, smaller than the size of the metal base 11 in the Z direction.

Figure 13A:
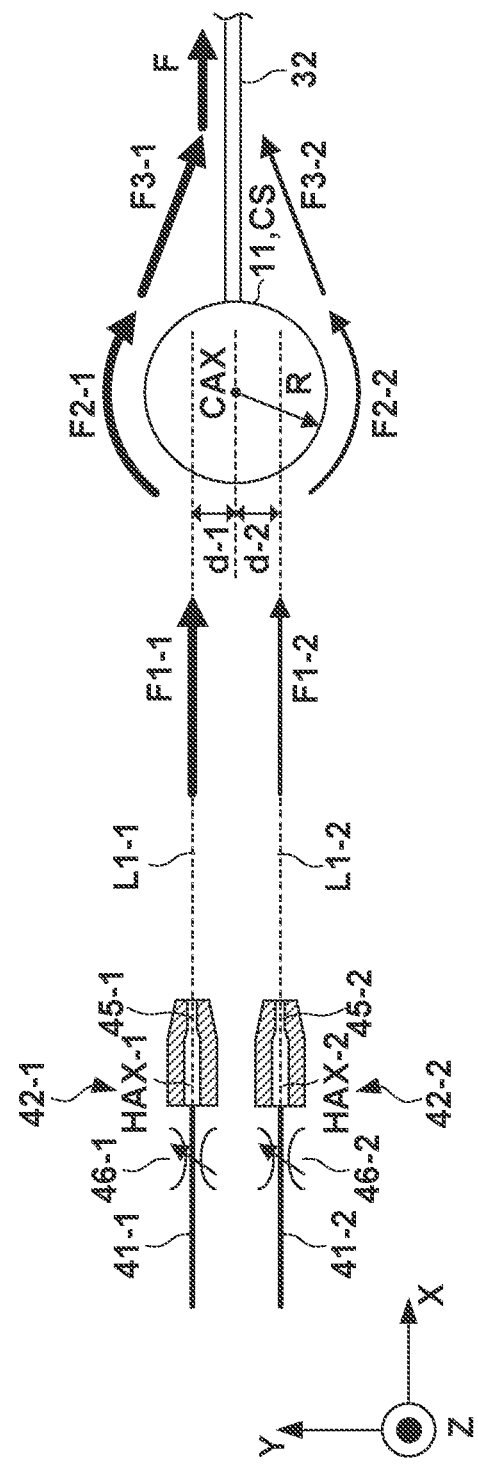
FIGS. 13A and 13B are views schematically showing the configuration of a light source apparatus according to the fourth embodiment.
Figure 13B:
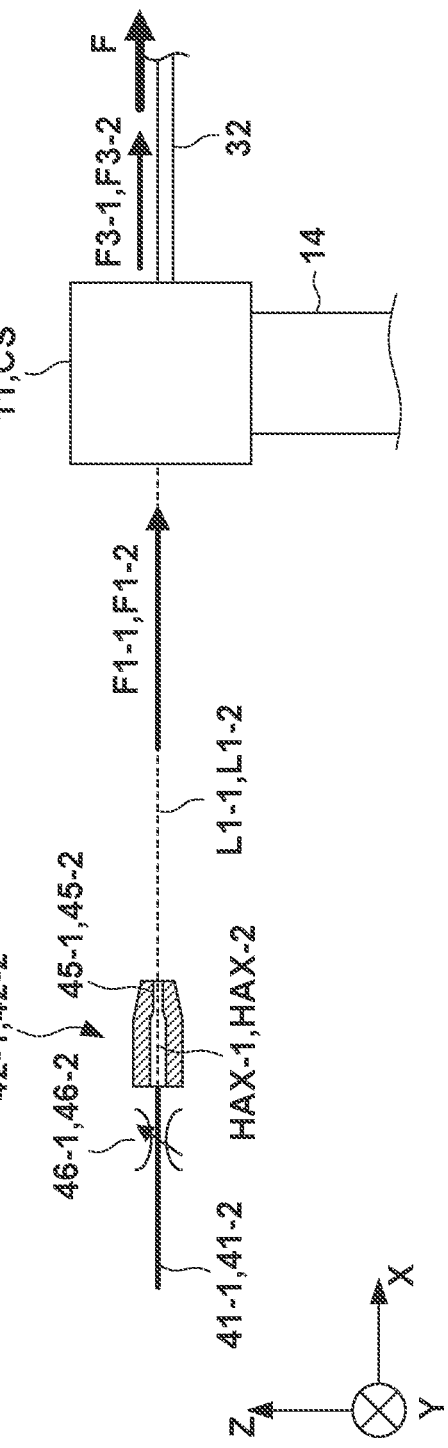

The configuration of a light source apparatus 110 in an exposure apparatus according to the fourth embodiment will be described below with reference to FIGS. 13A and 13B. The fourth embodiment is a modification of the second embodiment, and matters that are not mentioned as the fourth embodiment can comply with the second embodiment. FIGS. 13A and 13B schematically show an arrangement example of a metal base 11 and nozzles 42 in the light source apparatus 110 according to the fourth embodiment. FIG. 13A shows a plan view, that is, orthogonal projection to the X-Y plane. FIG. 13B shows a side view.

In the light source apparatus 110 according to the fourth embodiment, a first flow amount restrictor 46-1 and a second flow amount restrictor 46-2 are provided as adjusting mechanisms that adjust the flow amount of a gas to be supplied from a gas supplier 40 to a first nozzle 42-1 and a second nozzle 42-2. The first flow amount restrictor 46-1 and the second flow amount restrictor 46-2 may be provided halfway through supply tubes 41a and 41b, or may be incorporated in the gas supplier 40.

In an example, the first flow amount restrictor 46-1 and the second flow amount restrictor 46-2 can be adjusted or controlled such that the flow amount of a flow F1-1 becomes larger than the function of a flow F1-2. In this case, the direction of a flow F after flows F3-1 and F3-2 merge is closer to the flow F3-1 than the flow F3-2. The first flow amount restrictor 46-1 and the second flow amount restrictor 46-2 may be manual flow amount restrictors, or may be flow amount restrictors that can be controlled by a controller (not shown). The fourth embodiment is advantageous in adjusting or controlling the direction of the flow F in a case in which the arrangement of the nozzles 42-1 and 42-2 and/or the arrangement of a lead wire 32 has restrictions.

An article manufacturing method according to the embodiment will be described below. The article manufacturing method is suitable for manufacturing, for example, an article such as a device (a semiconductor element, a magnetic storage medium, a liquid crystal display element, or the like) or a color filter. The article manufacturing method can include an exposure step of exposing a substrate (to which a photoresist is applied) using the above-described exposure apparatus, a development step of developing the substrate exposed in the exposure step, and a processing step of processing the substrate that has undergone the development step to obtain an article. The processing step can include, for example, known processes (for example, oxidation, deposition, vapor deposition, doping, planarization, etching, resist removal, dicing, bonding, and packaging). The article manufacturing method according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-167964, filed Oct. 2, 2020, which is hereby incorporated by reference herein in its entirety.

What is claimed is:

1. A light source apparatus comprising a holder configured to hold a lamp including a metal base having a cylindrical surface, a condensing mirror configured to condense light generated by the lamp, a first nozzle including a first ejection hole configured to eject a gas to cool the metal base, and a second nozzle including a second ejection hole configured to eject the gas to cool the metal base,
   wherein a distance between a first straight line including a center axis of the first ejection hole and a center axis of the metal base ranges from not less than ½ of a radius of the cylindrical surface to not more than the radius,
   wherein a distance between a second straight line including a center axis of the second ejection hole and the center axis of the metal base ranges from not less than ½ of the radius of the cylindrical surface to not more than the radius, and
   wherein the center axis of the metal base is arranged between the first straight line including the center axis of the first ejection hole and the second straight line including the center axis of the second ejection hole.

2. An exposure apparatus comprising:
   a light source apparatus according to claim 1;
   an illumination optical system configured to illuminate an original using light from the light source apparatus; and
   a projection optical system configured to project a pattern of the original to a substrate.

3. An article manufacturing method comprising:
   exposing a substrate using an exposure apparatus according to claim 2;
   developing the substrate exposed in the exposing; and
   processing the substrate that has undergone the developing to obtain an article.

4. A light source apparatus comprising a holder configured to hold a lamp including a metal base having a cylindrical surface, a condensing mirror configured to condense light generated by the lamp, a first nozzle including a first ejection hole configured to eject a gas to cool the metal base, and a second nozzle including a second ejection hole configured to eject the gas to cool the metal base,
   wherein a distance between a first straight line including a center axis of the first ejection hole and a center axis of the metal base ranges from not less than ½ of a radius of the cylindrical surface to not more than the radius,
   wherein a distance between a second straight line including a center axis of the second ejection hole and the center axis of the metal base ranges from not less than ½ of the radius of the cylindrical surface to not more than the radius, and
   wherein in orthogonal projection to a plane orthogonal to the center axis of the metal base, the first straight line including the center axis of the ejection hole and the second straight line including the center axis of the second ejection hole cross each other.

5. The apparatus according to claim 4, wherein in a direction parallel to the center axis of the metal base, a distance between an intersection between the first straight line and the cylindrical surface and an intersection between the second straight line and the cylindrical surface is not less than 10 mm.

6. An exposure apparatus comprising:
   a light source apparatus according to claim 4;
   an illumination optical system configured to illuminate an original using light from the light source apparatus; and
   a projection optical system configured to project a pattern of the original to a substrate.

7. An article manufacturing method comprising:
   exposing a substrate using an exposure apparatus according to claim 6;
   developing the substrate exposed in the exposing; and
   processing the substrate that has undergone the developing to obtain an article.

8. A light source apparatus comprising a holder configured to hold a lamp including a metal base having a cylindrical surface, a condensing mirror configured to condense light generated by the lamp, and a nozzle including an ejection hole configured to eject a gas to cool the metal base,
   wherein a distance between a straight line including a center axis of the ejection hole and a center axis of the metal base ranges from not less than ½ of a radius of the cylindrical surface to not more than the radius,
   wherein a lead wire is connected to the metal base, and the metal base is arranged between the ejection hole and a connecting portion between the metal base and the lead wire, and
   wherein in orthogonal projection to an X-Y plane in an XYZ coordinate system in which the center axis of the metal base is a Z-axis, and an axis parallel to the center axis of the ejection hole is an X-axis, the ejection hole is arranged in one of a second quadrant and a third quadrant, and at least a portion of the lead wire, which is irradiated with a luminous flux from the condensing mirror, is arranged in a region formed by a first quadrant and a fourth quadrant.

9. An exposure apparatus comprising:
   a light source apparatus according to claim 8;
   an illumination optical system configured to illuminate an original using light from the light source apparatus; and
   a projection optical system configured to project a pattern of the original to a substrate.

10. An article manufacturing method comprising:
    exposing a substrate using an exposure apparatus according to claim 9;
    developing the substrate exposed in the exposing; and
    processing the substrate that has undergone the developing to obtain an article.

11. A light source apparatus comprising a holder configured to hold a lamp including a metal base having a cylindrical surface, a condensing mirror configured to condense light generated by the lamp, and a nozzle including an ejection hole configured to eject a gas to cool the metal base,
   wherein a distance between a straight line including a center axis of the ejection hole and a center axis of the metal base ranges from not less than ½ of a radius of the cylindrical surface to not more than the radius,
   wherein a flow velocity distribution of the gas ejected from the ejection hole is axisymmetric with respect to the center axis of the ejection hole, and
   wherein the ejection hole is a circular opening whose diameter falls within a range of not less than 1 mm to not more than 2 mm, and a maximum flow velocity of the gas ejected from the ejection hole in the ejection hole falls within a range of not less than 50 m/sec to not more than 100 m/sec.

12. An exposure apparatus comprising:
   a light source apparatus according to claim 11;
   an illumination optical system configured to illuminate an original using light from the light source apparatus; and
   a projection optical system configured to project a pattern of the original to a substrate.

13. An article manufacturing method comprising:
   exposing a substrate using an exposure apparatus according to claim 12;
   developing the substrate exposed in the exposing; and
   processing the substrate that has undergone the developing to obtain an article.

* * * * *